United States Patent [19]

Deprez

[11] Patent Number: 5,945,262
[45] Date of Patent: *Aug. 31, 1999

[54] CORRECTING LIQUID FOR A SILVER IMAGED LITHOGRAPHIC PRINTING PLATE

[75] Inventor: Lode Deprez, Wachtebeke, Belgium

[73] Assignee: Agfa-Gevaert, N.B., Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/760,383

[22] Filed: Dec. 4, 1996

Related U.S. Application Data

[60] Provisional application No. 60/011,639, Feb. 14, 1996.

[30] Foreign Application Priority Data

Dec. 14, 1995 [EP] European Pat. Off. .............. 95203493

[51] Int. Cl.$^6$ ............................... G03C 5/44; G03F 7/07; G03F 7/26; B41M 5/00
[52] U.S. Cl. .................. 430/331; 430/204; 430/264; 430/460; 430/461; 430/493; 101/465; 252/186.1
[58] Field of Search ..................... 430/204, 248, 430/264, 460, 461, 331, 493; 101/465; 252/186.1

[56] References Cited

U.S. PATENT DOCUMENTS

| | | | |
|---|---|---|---|
| 4,756,918 | 7/1988 | Ueda et al. | 430/460 |
| 4,780,398 | 10/1988 | Kim | 430/460 |
| 4,837,122 | 6/1989 | Kondo et al. | 430/205 |
| 4,933,264 | 6/1990 | Haseler et al. | 430/460 |
| 4,939,075 | 7/1990 | Bergthaller et al. | 430/460 |
| 4,985,347 | 1/1991 | Fujimoto et al. | 430/460 |
| 4,987,058 | 1/1991 | Spriewald et al. | 430/460 |
| 5,043,253 | 8/1991 | Ishikawa et al. | 430/460 |
| 5,139,920 | 8/1992 | Hayashi et al. | 430/461 |
| 5,298,370 | 3/1994 | Kojima et al. | 430/460 |

*Primary Examiner*—Richard L. Schilling
*Attorney, Agent, or Firm*—Breiner & Breiner

[57] ABSTRACT

The present invention provides a correcting liquid for silver imaged lithographic printing plates being an aqueous solution having a pH in the range between 5.5 and 8.5 and comprising a iron (III) complex salt of an organic acid, a sulphite or a metabisulphite, a silver halide solvent and an accelerator, said accelerator being an organic heterocyclic compound having a mercapto- or thione group and not having a hydrophilic substituent besides the said mercapto or thione group characterized in that said accelerator is present in an amount ranging from 0.04 to 0.4 mole per liter of correcting liquid.

7 Claims, No Drawings

CORRECTING LIQUID FOR A SILVER IMAGED LITHOGRAPHIC PRINTING PLATE

This application claims benefit of Provisional application Ser. No. 60/011,639, filed Feb. 14, 1996.

DESCRIPTION

1. Field of the Invention

The present invention relates to an improved correcting liquid for silver imaged lithographic printing plates particularly for silver imaged lithographic printing plates obtained according to the silver salt diffusion transfer process.

2. Background of the Invention

In the process of the preparation of a print from a lithographic printing plate it is frequently necessary in order to obtain a faithful print of the original to correct the printing areas of the lithographic printing plate. In one embodiment this requires that portions of the greasy ink accepting areas of the lithographic plate are made into greasy ink rejecting hydrophilic areas. In the case of silver imaged lithographic printing plates this is normally effected by applying to said areas of the lithographic plate a reactive fluid which deletes the ink receptivity of the silver image by rendering hydrophilic the undesired portion of the silver image. More particularly said reactive agents removes the ink receptivity of undesired portions of silver images photographically or physically formed on lithographic printing plates by rendering completely hydrophilic that portion of the silver image. Said reactive agents are called correcting liquids or correctors while the act of rendering portions of the silver image completely hydrophilic is called correction of the lithographic printing plate.

Generally portions of lithographic printing plate made by a photomechanical process which require correction include those which are already present in originals to be copied, produced at the time of exposure or produced due to uneven developing treatment, etc.

That is, for example, where the originals contain undesired images or have dust, dirty powders, finger prints and other stains and furthermore, when laminated originals are used, a shadow may be produced by the exposure. In order to obtain good prints, said portions must be corrected at the stage of plate making and printing. Generally the correction is an essential treatment and so it is preferred that necessary corrections can be carried out at an optional stage in plate making and printing procedure.

Many proposals have been made for correcting liquids for lithographic printing plates which use silver images as ink receptive areas.

For example correcting liquids comprising mercapto or thione groups and a hydrophilic group and in a number of cases a water soluble bromide or iodide are disclosed in JN 06/266114, 06/266113, 06/102672, 06/67440, 03/282476, 01/254962, 51/21901, 48/92101. However there are disadvantages to these correcting liquids such as adverse effects on human bodies due to strong acidity, a slow action on the silver image and a poor stability on storage. The latter can be simulated by keeping the correcting liquid at a higher temperature for some time.

SUMMARY OF THE INVENTION

It is an object of the present invention to provide a correcting liquid for silver imaged lithographic printing plates improved for the speed of correction.

It is a further object of the present invention to provide a correcting liquid for silver imaged lithographic printing plates improved for storage stability.

Still further objects of the present invention will become clear from the description hereinafter.

According to the present invention there is provided a correcting liquid for silver imaged lithographic printing plates being an aqueous solution having a pH in the range between 5.5 and 8.5 and comprising a iron (III) complex salt of an organic acid, a sulphite or a metabisulphite, a silver halide solvent and an accelerator, said accelerator being an organic heterocyclic compound having a mercapto- or thione group and not having a hydrophilic substituent besides the said mercapto or thione group characterized in that said accelerator is present in an amount ranging from 0.04 to 0.4 mole per liter of correcting liquid.

DETAILED DESCRIPTION OF THE INVENTION

According to the present invention it has been found that a correcting liquid with the composition as indicated above has a higher speed of correction and an improved storage stability.

A hydrophilic substituent besides the said mercapto group in accordance with the invention can be an amino group not comprised in a heterocyclic group, an ammonium group, a hydroxyl, a sulfo group or a carboxyl.

Said organic heterocyclic compound having a mercapto- or thione group is preferably a non-ionic compound. More preferably said organic heterocyclic compound having a mercapto- or thione group contains in the heterocyclic group at least two nitrogen atoms, most preferably at least three nitrogen atoms.

Examples of suitable accelerators are given in table 1

TABLE 1

| Structure | |
|---|---|
| Na–S–C(=NH)–N=N (imidazole-type) | cpd 1 |
| H$_3$C–C(=N)–O–C(SH)=N | cpd 2 |
| NH–N=C(SH)–N=N (triazole-type) | cpd 3 |

Preferably said compounds are used in an amount ranging from 0.08 to 0.2 mole per liter correcting liquid.

The oxidizing compound is a iron (III) complex salt of an organic acid. References to iron (III) refers to iron in the +3 oxidation state. A preferred example of the iron (III) complex salt of an organic acid is a iron (III) complex salt of an aminopolycarboxylic acid, but a iron (III) salt of a phosphonic acid may also be used.

The iron (III) complex salts of an organic acid are ordinarily used in the form of complex salts, but iron (III) ion complex salts may be formed in the solution using iron (III) salts such as iron (III) sulfate, iron (III) chloride, iron (III) nitrate, iron (III) ammonium sulfate, iron (III) phosphate, etc. and organic acids and/or its salts.

The iron (III) complex salt of an aminopolycarboxylic acid is a complex of iron (III) ion and an aminopolycarboxylic acid or a salt thereof.

Typical examples of aminopolycarboxylic acids and salts thereof are diethylenetriaminepentaacetic acid and its salts, ethylenediamine-N-(2-oxyethyl)-N,N',N'-triacetic acid and its salts, propylenediaminetetraacetic acid and its salts, nitrilotriacetic acid and its salts, cyclohexanediaminetetraacetic acid and its salts, iminodiacetic acid, dihydroxyethylglycine, ethylenediaminetetrapropionic acid, etc. A more preferably example of aminopolycarboxylic acids and salts thereof are ethylenediaminetetraacetic acid (EDTA) and its salts.

Typical examples of a phosphonic acid and salts thereof are diethylenetriaminepentamethylenephosphonic acid and its salts, cyclohexanediaminetetramethylenephosphonic acid and its salts, triethylenetetraminehexamethylenephosphonic acid and its salts, glycoletherdiaminetetramethylenephosphonic acid and its salts, 1,2-diaminopropanetetramethylenephosphonic acid and its salts, methyliminodimethylenephosphonic acid and its salts, 1,3-diaminopropane-2-ol tetramethylenephosphonic acid and its salts, ethylenediaminetetramethylenephosphonic acid and its salts, etc.

Organic acid iron (III) complex salts comprising optional combinations of these organic acid salts and said iron (III) salts can be used.

The organic acid iron (III) complex salts are used for oxidizing the silver images utilized as ink receptive areas and preferably used in a large amount for oxidizing such silver images to which is firmly absorbed mercapto compounds and the like which are generally used for enhancing oleophilicity. Preferably, the iron (III) complex salts are used in an amount of 0.07 to 0.7 mole per liter of correcting liquid, more preferably in an amount of 0.15 to 0.35 mole per liter of correcting liquid.

Preferably the correcting liquid contains an extra amount of aminopolycarboxylic acid or phosphonic acid, more preferably between 0.02 and 0.2 mole per liter of correcting liquid, most preferably between 0.04 and 0.1 mole per liter of correcting liquid Preferably the aminopolycarboxylic acid or phosphonic acid used in the formation of the organic acid iron (III) complex salts and the aminopolycarboxylic acid or phosphonic acid being present in an extra amount are both either an aminopolycarboxylic acid or phosphonic acid, more preferably they are identical.

The correcting liquid comprises a sulphite or a metabisulphite, preferably a sulphite, more preferably sodium sulphite. Said sulphite is preferably present in an amount ranging from 0.06 to 0.6 mole per liter of correcting liquid, more preferably in an amount ranging from 0.12 to 0.28 mole per liter of correcting liquid, where the metabisulphite is preferably present in an amount ranging from 0.03 to 0.3 mole per liter of correcting liquid, more preferably in an amount ranging from 0.06 to 0.14 mole per liter of correcting liquid.

The correcting liquid comprises a silver halide solvent e.g. 2-mercaptobenzoic acid, a cyclic imide, an oxazolidone, a thiocyanate, an alkanolamine and a thioether as described furtheron in the present disclosure. Preferably said silver halide solvent is a thiosulphate, more preferably sodium or ammonium thiosulphate. Particularly preferably said thiosulphate is present in an amount ranging from 0.5 to 5 mole per liter of correcting liquid, most preferably in an amount ranging from 1.0 to 2.5 mole per liter of correcting liquid.

The correcting liquid has a pH in the range between 5.5 and 8.5, more preferably in the range between 6 and 8. Said pH is preferably obtained by use of a buffer e.g. a phosphate buffer, a citrate buffer, an ammonium buffer or mixtures thereof.

The correcting liquid preferably contains a surfactant, more preferably an amphoteric surfactant as described in U.S. Pat. No. 4,837,122, most preferably n.$C_{16}H_{33}N^+(CH_3)_2CH_2COO^-$ (sold as Ambiteric H by LONZA, Switserland). Said surfactant is preferably used in an amount ranging from 0.3 g to 3 g per liter of correcting liquid, more preferably in an amount ranging from 0.6 g to 1.5 g per liter of correcting liquid.

The correcting liquid can contain water soluble bromides and/or water soluble iodides up to the amount wherein said bromides and/or iodides are soluble in the correcting liquid. Examples of such water soluble bromides and iodides are potassium bromide or iodide, sodium bromide or iodide, ammonium bromide and iodide.

The correcting liquid may contain organic solvents such as alcohols, ethers, amides, etc. A preferred organic solvent is methoxy-2-propanol. Said organic solvent is more preferably used in an amount of 50 ml to 500 ml per liter of correcting liquid, most preferably in an amount of 100 to 300 ml of the correcting liquid.

The correcting liquid may contain thickening agents e.g. hydroxyethylcellulose and carboxymethylcellulose, preferably in an amount between 30 g and 250 g per liter correcting liquid, more preferably in an amount between 60 g and 120 g per liter of correcting liquid.

The correcting liquid can be applied to the silver imaged lithographic printing plate at any time after the preparation of said lithographic printing plate. Preferably the correction liquid is applied to the lithographic printing plate before starting the printing process, but if necessary the correcting liquid can be applied during the printing.

The correcting liquid is preferably applied on a silver imaged lithographic printing plate with the aid of a felt tipped correcting pen, whereof the container is filled with the correcting liquid. Alternatively a correcting gel, being a correcting fluid containing a thickening agent can be used for corrections on a silver imaged lithographic printing plate.

A silver imaged lithographic printing plate for use in this invention is preferably prepared according to the principles of the silver complex diffusion transfer reversal process, hereinafter called DTR-process, having been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in water/permeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 an imaging element is provided comprising a support provided in the order given with a silver halide emulsion layer and a layer containing physical development nuclei serving as the image-receiving layer in water permeable relationshp with said emulsion layer. After information-wise exposure and development the imaged element is used as a printing plate without the removal of the emulsion layer.

Layers being in water/permeable contact with each other are layers that are contiguous to each other or only separated from each other by (a) water/permeable layer(s). The nature of a water/permeable layer is such that it does not substantially inhibit or restrain the diffusion of water or of compounds contained in an aqueous solution e.g. developing agents or complexed silver ions.

Supports suitable for use in said imaging elements may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966).

According to the present invention the emulsion or emulsions preferably consist principally or totally of silver chloride while a fraction of silver bromide may be present ranging from 0.1 mole % to 40 mole %. When the fraction of silver bromide is 5% or more, the emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 $\mu$m , preferably from 0.25 to 0.45 $\mu$m.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsion can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethanesulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions can be found in e.g. Product Licensing Index, Vol. 92, December 1971, publication 9232, p. 107–109.

The layer containing physical development nuclei can be free of hydrophilic binder but preferably comprises amounts upto e.g. 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 μm and more preferably between 2 μm and 5 μm. The matting agents are generally used in a total amount in the imaging element of 0.1 g/m² to 2.5 g/m². At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In a preferred embodiment in connection with the present embodiment a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the Theological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in a wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present embodiment may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present embodiment may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth)acrylates, and styrene sulphonic acids.

The imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element can also be exposed with the aid of i.a. laser recorders and cathode rays tubes.

The alkaline processing liquid used for developing the imaging element in accordance with the DTR-method preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

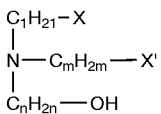

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

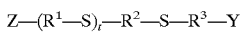

$$Z—(R^1—S)_t—R^2—S—R^3—Y$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

Preferably at least part and more preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m², more preferably between 0.1 and 5 mmol/m² and most preferably between 0.5 and 1.5 mmol/m². More details are disclosed in EP-A-0,554,585

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material, preferably in the silver halide emulsion layer of the photographic material, in an amount of less than 150 mg/g of silver halide expressed as $AgNO_3$, more preferably in an amount of less than 100 mg/g of silver halide expressed as $AgNO_3$.

The alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. Nos. 3,776,728, and 4,563,410. Preferred compounds correspond to one of the following formulas:

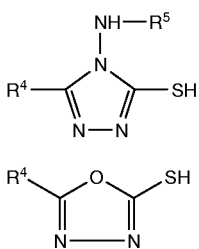

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos.3,038,805—4,038,075—4,292,400—4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic/hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another embodiment a lithographic printing plate can be obtained by means of the DTR-process using an imaging element comprising in the order given a hydrophilic surface of a support, a layer containing physical development nuclei and a silver halide emulsion layer.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. Nos. 3,971,660, 4,284,705, EP-A 405,016 and EP-A 450,199 which therefor are incorporated herein by reference.

Flexible supports e.g. a paper support or a resin support are described above.

Said hydrophilic surface of a support may be a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints. Sealing is not necessary but may still improve the printing results. Preferably the aluminum foil has a roughness with a CLA value between 0.2 and 1.5 μm, an anodization layer with a thickness between 0.4 and 2.0 μm and is sealed with an aqueous bicarbonate solution. More details on the preparation of a grained, anodized and sealed aluminum foil are given in U.S. Pat. No. 3,861,917 and in the documents referred to therein.

To promote the image sharpness and, as a consequence thereof, the sharpness of the final printed copy, the anodization layer may be coloured in the mass with an antihalation dye or pigment e.g. as described in JA-Pu-58-14,797.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPas at a shearing rate of 1000 $s^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephtalate film base at a dry thickness of 1.2 $g/m^2$, dried for 3 days at 57° C. and 35% R.H. and dipped in water of 30° C., said gelatin layer is dissolved for more than 95% by weight within 5 minutes.

The imaging element of the present embodiment may be imaged using a camera-exposure or a scanning exposure as described above followed by a development step in the presence of development agent(s) and silver halide solvent (s) as described above so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilitate the removal of the silver halide emulsion layer it is advantageous to provide a layer between the layer containing physical development nuclei and the silver halide emulsion layer comprising a hydrophilic non-proteinic film-forming polymer e.g. polyvinyl alcohol, polymer beads e.g. poly(meth)acrylate beads, particles of a water insoluble inorganic compound having a number average size not lower than 0.1 μm, alkali insoluble non-polymeric organic compounds having a melting point of at least 50° C. and a number average size between 0.1 μm and 10 μm and particles of an alkali insoluble polymer obtainable by polycondensation with a number average size between 0.02 μm and 10 μm. Such type of layers are disclosed in EP-A-

483415, EP-A-410500, EP-A-94203779.7, EP-A-95201713.5 and EP-A-95203052.6.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

A lithographic plate is thus obtained.

The invention will now be illustrated by the following examples without however the intention to limit the invention thereto. All parts are by weight unless otherwise specified.

EXAMPLE 1

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. 4-hydroxy-6-methyl-1,3,3a,7-terraazaindene was added as stabilizer in an amount of 290 mg/mole of silver halide and prior to coating the emulsion was orthochromatically sensitized by adding a green sensitizing dye. A base layer coating solution was prepared having the following composition:

| | |
|---|---|
| gelatin | 5.5% |
| carbon black | 0.76% |
| silica particles (5 μm) | 1.6% |

Preparation of the silver imaged lithographic printing plate.

The emulsion coating solution and base layer coating solution were simultaneously coated by means of the slide hopper coating technique to a polyethylene terephthalate support. The emulsion layer was coated such that the silver halide coverage expressed as $AgNO_3$ was 1.5 g/m$^2$ and the gelatin content was 1.5 g/m$^2$. The emulsion layer further contained 0.15 g/m$^2$ of 1-phenyl-4,4'-dimethyl-3-pyrazolidone, 0.25 g/m$^2$ of hydroquinone and 100 mg/m$^2$ of formaldehyde. The base layer was coated such that the transmission density of the packet of the support and the base layer was 0.65.

The thus obtained element was dried and subjected to a temperature of 40° C. for 5 days and then the emulsion layer was overcoated with a layer containing PdS as physical development nuclei, hydroquinone at 0.4 g/m$^2$ and formaldehyde at 100 mg/m$^2$.

The following processing solutions were prepared

| Activator | | |
|---|---|---|
| sodium hydroxide | 30 | g |
| sodium sulphite anh. | 35 | g |
| 2-aminoethyl-aminoethanol | 20 | ml |
| 1-methyl, 4-allyl, 5-methyl-1,2,4-triazolium-3-thiolate | 1.1 | g |
| 2-mercapto-5-n.heptyl-oxa-3,4-diazole | 150 | mg |
| water to make | 1 | l |
| Neutralization solutions | | |
| NaH$_2$PO$_4$.2H$_2$O | 40 | g |
| Non-ionic surfactant | 200 | mg |
| Compound A[a] | 800 | mg |
| Triethanolamine | 10 | ml |
| Sodium benzoate | 1 | g |
| Sodium sulphite | 4 | g |
| Turpinal 2NZ[b] | 1 | g |
| Ethylenediamine-tetraacetic acid sodium salt | 1 | g |
| water to make | 1 | l |
| pH | 6.0 | |

[a] Compound A is a mercaptotetrazole substituted in the 1-position with —CH$_2$CON(n.C$_4$H$_9$)$_2$
[b] Turpinal 2NZ is a trade name of Henkel, Belgium for phosphonic acid, (1-hydroxyethylidene)bis-, disodium salt.

The unexposed imaging element was processed with the above described activator for 20 seconds at 30° C., subsequently neutralized at 25° C. with the neutralization solution described above, dried and subsequently divided into 30 samples of silver imaged lithographic printing plate.

Ten correcting liquids were prepared which had an identical composition with the exception of the accelerator. The common composition of the the correcting liquid was as follows:

| | | |
|---|---|---|
| sodium sulphite | 25 | g/l |
| sodium EDTA[a] | 25 | g/l |
| citric acid | 11 | g/l |
| sodium hydroxide | 2 | g/l |
| ammonium thiosulfate | 250 | g/l |
| Ambiteric H (C$_{16}$H$_{33}$N$^+$(CH$_3$)$_2$CH$_2$COO$^-$) | 1 | g/l |
| Iron (III) ammonium EDTA[a] | 81 | g/l |
| accelerator | 0.125 | mole/l |
| pH brought with sodium hydroxide at | 7.1 | |

[a] EDTA stands for ethylenediamine-tetraacetic acid

In each of the correcting liquids was brought a sample of the silver imaged lithographic printing plate. The effectiveness of the ten correcting liquids was expressed by the following parameters, measured with a spectrophotometer:

t 50%: the time needed to diminish the transmission density to 50% of its original value;

t 100%: the time needed to remove completely the silver image;

%30 s: the percentage decrease of the transmission density after 30 s treatment in the correcting liquid.

The results are given in table 2.

TABLE 2

| Accelerator[a] | t 100% | t 50% | %30 s |
|---|---|---|---|
| none | >>25 s | >>50 s | 21 |
| Cpd 1 | 25 s | 5 s | 100 |

TABLE 2-continued

| Accelerator[a] | t 100% | t 50% | %30 s |
|---|---|---|---|
| Cpd 2 | 40 s | 15 s | 95 |
| Cpd 3 | 30 s | 4 s | 100 |
| Cpd 4 | >>50 s | >>50 s | 16 |
| Cpd 5 | >>50 s | >>50 s | 21 |
| Cpd 6 | >>50 s | >>50 s | 15 |
| Cpd 7 | >>50 s | >>50 s | 15 |
| Cpd 8 | >>50 s | >>50 s | 13 |
| Cpd 9 | >>50 s | >>50 s | 15 |

[a] The formula of compounds 1–3 is given in table 1 while the formula of compounds 4–10 is given in table 3.

TABLE 3

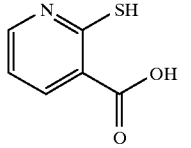

cpd 4

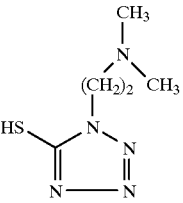

cpd 5

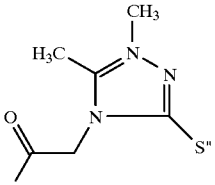

cpd 6

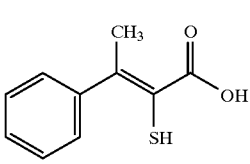

cpd 7

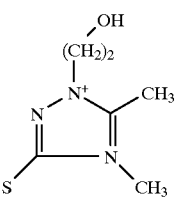

cpd 8

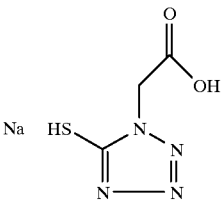

cpd 9

It is clear that correcting liquids comprising the compounds 1–3 (correcting liquids according to the invention) are very effective while correcting liquids comprising compounds 4–10 (comparative correcting liquids) have a very low effectiveness.

EXAMPLE 2

Four correcting liquids were prepared which had an identical composition with the exception of the amount of sodium sulphite. The common composition of the the correcting liquid was as follows:

| | | |
|---|---|---|
| sodium EDTA[a] | 25 | g/l |
| sulphuric acid (6N) | 60 | ml/l |
| ammonia (33%) | 26 | ml/l |
| ammonium thiosulfate | 200 | g/L |
| Ambiteric H ($C_{16}H_{33}N^+(CH_3)_2CH_2COO^-$) | 1 | g/L |
| Iron (III) ammonium EDTA[a] | 81 | g/l |
| cpd 3 | 7.5 | g/l |
| pH brought at | 7.5 | |

[a] EDTA stands for ethylenediamine-tetraacetic acid

Each of the correcting liquids was tested as a fresh solution and after standing in a sealed bottle for 3 days at 60° C. In each of the correcting liquids was brought a sample of the silver imaged lithographic printing plate. The effectiveness of the eight correcting liquids was measured by the parameters as given in example 1. The results are given in table 4

TABLE 4

| $Na_2SO_3$ g/l | t 50% fresh | t 100% fresh | t 50% 3 d 60° C. | t 100% 3 d 60° C. |
|---|---|---|---|---|
| 0 | 6 | 25 | >30 | >>30 |
| 10 | 7 | 30 | 15 | >30 |
| 20 | 10 | 30 | 12 | 30 |
| 40 | 15 | 30 | 20 | >30 |

It is clear from these results that the storage stability of the correcting liquids is improved when said correcting liquids comprise sodium sulphite and that the optimum for the amount on sodium sulphite is comprised between 10 g/l and 40 g/l.

EXAMPLE 3

Five correcting liquids were prepared which had an identical composition with the exception of the pH. The common composition of the correcting liquid was as follows:

| | | |
|---|---|---|
| sodium sulphite | 25 | g/l |
| ammonium thiosulfate | 240 | g/L |
| Ambiteric H ($C_{16}H_{33}N^+(CH_3)_2CH_2COO^-$) | 1 | g/L |
| Iron (III) ammonium EDTA[a] | 81 | g/l |
| cpd 3 | 7.5 | g/l |
| pH brought at the values indicated in table 5 with either sulphuric acid 6N or ammonia 33%. | | |

[a] EDTA stands for ethylenediamine-tetraacetic acid

Each of the correcting liquids was tested as a fresh solution an after standing in a sealed bottle for 3 days at 60° C. In each of the correcting liquids was brought a sample of the silver imaged lithographic printing plate. The effectiveness of the eight correcting liquids was measured by the parameters as given in example 1. The results are given in table 5

TABLE 5

| pH | t 50% fresh | t 100% fresh | t 50% 3 d 60° C. | t 100% 3 d 60° C. |
|---|---|---|---|---|
| 5 | 9 | 25 | 20 | >>30 |
| 6 | 10 | 30 | 13 | 30 |
| 7 | 9 | 30 | 11 | 30 |
| 8 | 10 | 30 | 12 | 30 |
| 9 | 15 | >30 | 14 | >30 |

It is clear from these results that a correcting liquid having a pH higher than 9 has a low effectiveness while a correcting liquid having a pH of 5 is not stable on storage (both comparison correcting liquids) while the correcting liquids having a pH of 6, 7 and 8 are very effective correcting liquids as well when used fresh as after standing for 3 days at 60° C. (correcting liquids according to the invention).

I claim:

1. A correcting liquid for silver imaged lithographic printing plates which is an aqueous solution having a pH in the range between 5.5 and 8.5 and comprising an iron (III) complex salt of an aminopoly-carboxylic acid or a phosphonic acid or salt(s) of said acids in an amount of 0.07 to 0.7 mole per liter and containing an extra amount of the aminopolycarboxylic acid or phosphonic acid, in the range between 0.02 and 0.2 mole per liter of correcting liquid, a sulphite or a metabisulphite, said sulphite being present in the correcting liquid in an amount ranging from 0.06 to 0.06 mole per liter of correcting liquid, a silver halide solvent, a non-fluorinated betaine surface active agent and an accelerator, said accelerator being an organic heterocyclic compound having a mercapto- or thione group and not having a hydrophilic substituent besides the said mercapto or thione group, said accelerator being present in an amount ranging from 0.04 to 0.4 mole per liter of correcting liquid.

2. A correcting liquid for silver imaged lithographic printing plates according to claim 1 wherein said accelerator contains in the heterocyclic group at least two nitrogen atoms.

3. A correcting liquid for silver imaged lithographic printing plates according to claim 1 wherein said accelerator is used in an amount ranging from 0.08 to 0.2 mole per liter of correcting liquid.

4. A correcting liquid for silver imaged lithographic printing plates according to claim 1 wherein said aminopolycarboxylic acid or salt(s) thereof is ethylenediaminetetraacetic acid (EDTA) or salt(s) thereof.

5. A correcting liquid for silver imaged lithographic printing plates according to claim 1 wherein thiosulphate is present in the correcting liquid in an amount ranging from 0.5 to 5.0 mole per liter of correcting liquid.

6. A correcting liquid for silver imaged lithographic printing plates according to claim 1 wherein the correcting liquid comprises a surfactant.

7. A correcting liquid for silver image lithographic printing plates according to claim 1 wherein the non-fluorinated betaine surface agent is $C_{16}H_{33}N^+(CH_3)_2CH_2COO^-$.

* * * * *

UNITED STATES PATENT AND TRADEMARK OFFICE
CERTIFICATE OF CORRECTION

PATENT NO. : 5,945,262
DATED : August 31, 1999
INVENTOR(S) : Lode Deprez

It is certified that error appears in the above-indentified patent and that said Letters Patent is hereby corrected as shown below:

On the title page, item:

[73] Assignee: "Agfa-Gevaert, N.B." should read
-- Agfa-Gevaert, N.V. --;

Column 5, line 6, "water/permeable relationship" should read
-- water permeable relationship --;

Column 5, line 20, "water/permeable contact" should read
-- water permeable contact --;

Column 5, line 22, "water/permeable layer(s)" should read
-- water permeable layer(s) --;

Column 5, line 23, "a water/permeable layer" should read
-- a water permeable layer --;

Column 7, line 56/57, "the Theological properties" should read
-- the rheological properties --;

Column 13, line 42, "-1,3,3a,7-terraazaindene" should read
-- -1,3,3a,7-tetraazaindene --;

Column 15, Table 3, cpd 6 should read

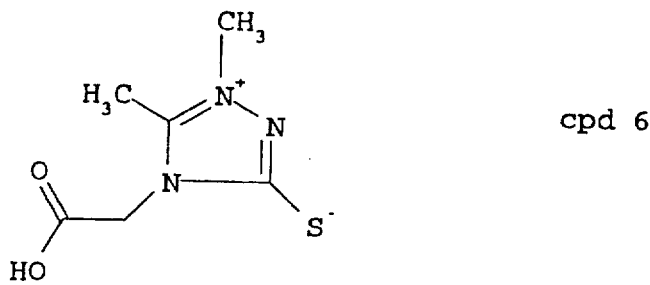

cpd 6

UNITED STATES PATENT AND TRADEMARK OFFICE
CERTIFICATE OF CORRECTION

PATENT NO. : 5,945,262
DATED : August 31, 1999
INVENTOR(S) : Lode Deprez

It is certified that error appears in the above-indentified patent and that said Letters Patent is hereby corrected as shown below:

Column 16, line 62, "solution an after" should read -- solution and after --;

Claim 1, column 17, lines 29/30, "from 0.06 to 0.06 mole per liter" should read -- from 0.06 to 0.6 mole per liter --.

Signed and Sealed this

Thirteenth Day of June, 2000

Attest:

Attesting Officer

Q. TODD DICKINSON

Director of Patents and Trademarks